United States Patent [19]
Wong

[11] Patent Number: 5,165,956
[45] Date of Patent: Nov. 24, 1992

[54] METHOD OF ENCAPSULATING AN ELECTRONIC DEVICE WITH A SILICONE ENCAPSULANT

[75] Inventor: Ching-Ping Wong, Lawrenceville, N.J.

[73] Assignee: AT&T Bell Laboratories, Murray Hill, N.J.

[21] Appl. No.: 766,304

[22] Filed: Sep. 27, 1991

[51] Int. Cl.$^5$ .............................................. B05D 5/12
[52] U.S. Cl. ..................................... 427/96; 427/387; 427/407.1
[58] Field of Search ....................... 427/96, 387, 407.1

[56] References Cited

PUBLICATIONS

"Monolithic High Voltage Gated Diode Crosspoint Array IC," H. T. Weston et al., IEDM Technical Digest (International Electronics Device Meeting), San Francisco, Calif., Dec. 1982, pp. 85–88.

"Electrical Performance and Reaction Kinetics of Silicone Gels," C. P. Wong, *Journal of Material Research*, vol. 5, No. 4, Apr. 1990, pp. 795–800.

"Understanding the Use of Silicone Gels for Non–Hermetic Plastic Packaging," C. P. Wong et al., *IEEE Transactions on Components, Hybrids, and Manufacturing Technology*, vol. 2, No. 4, Dec. 1989, pp. 421–425.

*Primary Examiner*—Bernard D. Pianalto
*Attorney, Agent, or Firm*—R. B. Anderson

[57] ABSTRACT

A silicone rubber potting compound contains an alkoxysilane ($\gamma$-glycidoxypropyltrimethoxysilane) as an adhesion promoter. Harmful effects caused by the adhesion promoter are alleviated by using as an additive a titanate having the form $Ti(OR)_4$, where R is an isopropyl, butyl, octyl, or acetylacetonate.

5 Claims, 1 Drawing Sheet

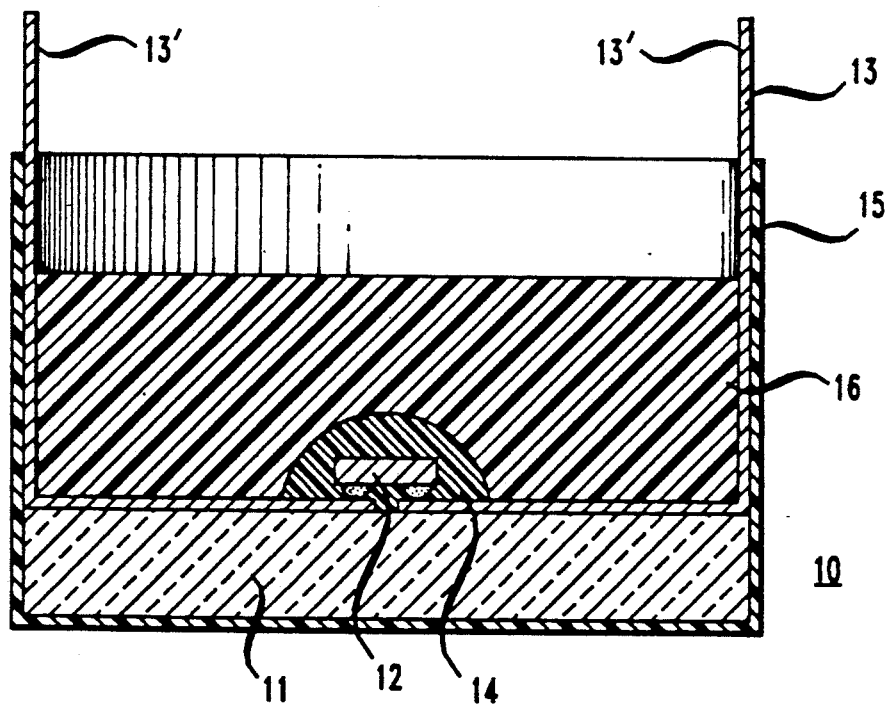

METHOD OF ENCAPSULATING AN ELECTRONIC DEVICE WITH A SILICONE ENCAPSULANT

TECHNICAL FIELD

This invention relates to electronic devices which are encapsulated by a polymeric encapsulant and, more particularly, to such devices which are encapsulated by a silicone resin.

BACKGROUND OF THE INVENTION

Hybrid integrated circuits are electronic devices in which one or more semiconductor chips, usually silicon chips, are connected to a bonding pad region of a circuit pattern on a ceramic substrate. (Semiconductor chips are also known as monolithic integrated circuits, or ICs, while hybrid integrated circuits are known as HICs.) The semiconductor chips must be protected from the external environment and, for this reason, they are sometimes encapsulated by silicone resin gels. See, for example, the papers, "Electrical Performance and Reaction Kinetics of Silicone Gels," C. P. Wong, Journal of Material Research, Vol. 5, No. 4, April, 1990, pp. 799-800, and "Understanding the Use of Silicone Gels for Non-Hermetic Plastic Packaging," C. P. Wong et al., IEEE Transactions on Components, Hybrids, and Manufacturing Technology, Vol. 2, No. 4, December, 1989, pp. 421-425. Such gels are capable of withstanding extremes of temperature, humidity, and electrical bias but are somewhat susceptible to the effects of rough handling; that is, a gel may rip or tear if impacted by the corner of a rigid object. Thus, to provide a more robust protection for the silicone gel and to provide protection to the exposed circuitry on the surface of the ceramic substrate, it has been proposed to encase the entire HIC with a plastic container and to fill the container with a silicone rubber referred to in the art as a potting compound. Appropriate silicone rubbers can have temperature-humidity-electrical bias (THB) characteristics that are comparable to silicone gels but of course they are physically harder and more robust.

It is known that any silicone potting compound must adhere dependably to the surfaces which are intended to be encapsulated. Thus, the silicone rubber that has been described should be one which can adhere to silicone gel, the HIC conductors, the ceramic, and the plastic container. It is further known to mix with a silicone resin a coupling agent or adhesion promoter such as γ-glycidoxypropyltrimethoxysilane which has been found to be effective for this purpose. Unfortunately, I have found that the use of such silicone rubbers tends to break down the silicone gel and to cause other problems.

SUMMARY OF THE INVENTION

I have determined that the source of the problems encountered using a silicone rubber containing γ-glycidoxypropyltrimethoxysilane is that excess amounts of γ-glycidoxypropyltrimethoxysilane tend to contaminate leads protruding from the device and to cause breakdown of the silicone gel. I have further found that these problems can be cured by adding to the uncured silicone resin rubber a quantity of titanate having the form $Ti(OR)_4$, where R is an isopropyl, butyl, octyl, or acetylacetonate. In particular, my experiments have shown that the problems are alleviated or eliminated by using uncured silicone resin rubber containing between 0.05 and 4 weight percent of a titanate selected from the group consisting of titanium butyl titanate, titanium octyl titanate, and titanium acetylacetonate.

These and other objects, features, and advantages of the invention will be better understood from a consideration of the following detailed description taken in conjunction with the accompany drawing.

BRIEF DESCRIPTION OF THE DRAWING

FIG. 1 is a schematic sectional view of an encapsulated electronic device made in accordance with an illustrative embodiment of the invention.

DETAILED DESCRIPTION

Referring now to FIG. 1, there is shown schematically a hybrid integrated circuit 10 comprising a ceramic substrate 11 upon which is mounted an electronic device 12, which may be an integrated circuit known as a GDX or gated diode crosspoint switch device. The GDX is described, for example, in the paper, "Monolithic High Voltage Gated Diode Crosspoint Array IC," H. T. Weston et al, IEDM Technical Digest (International Electronics Device Meeting), San Francisco, Calif., December, 1982, pp. 85-88 hereby incorporated herein by reference. Defined on the upper surface of the substrate 11 is a conductor pattern comprising conductors 13 connected to the electronic device 12. The electronic device 12 is encapsulated by a silicone resin encapsulant 14 which may be DC3-4939, a polydimethylsiloxane silicone resin, commercially available from the Dow Chemical Company of Midland, Michigan. The entirety of the ceramic substrate 11 is encased by a plastic casing 15 which is then filled with a silicone resin potting compound 16. Leads 13 which are connected to the GDX device 12 extend outside the package so that ends 13' can make contact to external circuitry. Although for simplicity only a single integrated circuit device 12 is shown, the typical HIC contains a plurality of such devices.

Silicone resin 14 may be any of a number of silicone gels which have been shown to provide optimum protection of silicon integrated circuits under conditions of high temperature, humidity, and electrical bias. Gels have a typical penetration number of thirty to eighty which implies that they can easily be penetrated or torn. For this reason, the resin 14 is encapsulated by a potting compound 6, which may be a silicone elastomer known as DC6279, available from the Dow Corning Company. This has a type 00 Shore durometer hardness of between thirty and one hundred which is the typical hardness of a rubber, and which provides robust protection from rough handling. The encapsulant 16 also protects from the environment those portions of the upper surface of ceramic substrate 11 and associated circuitry which are not covered by encapsulant 14.

A problem which has been observed with the apparatus shown in FIG. 1 is that visible globules form in the resin gel 14, particularly around the solder joints, which can lead to high voltage breakdown. With time, the lack of structural integrity of the gel 14 would also lead to corrosion due to moisture penetration. Further, films of material are observed on the surfaces of the exposed conductors 13' which could interfere with the subsequent bonding of these leads to external circuitry. My investigation shows that these problems originate with the use of γ-glycidoxypropyltrimethoxysilane as an adhesion promoter in the potting compound 16. This is a commonly used coupling agent which causes the silicone resin 16 potting compound to adhere to the leads 13, silicone gel 14, ceramic substrate 11, and plastic casing 15. Excess amounts of the γ-glycidoxypropyltrimethoxysilane migrate through the silicone gel to cause THB failures of the electronic device. It also migrates by capillary action and possibly by evaporation onto the leads 13'. I have further found that this problem can be reduced or eliminated by adding an appropriate titanate to the resin potting compound 16 prior to its application to the device.

Specifically, I have found that quantities of titanium butyl titanate, titanium octyl titanate, or titanium acetylacetonate, when added to the potting compound 16, will bond with the γ-glycidoxypropyltrimethoxysilane to substantially reduce or eliminate the problem. From this, I have determined that a titanate having the form Ti(OR)$_4$, where R is an isopropyl, butyl, octyl, or acetylacetonate, will react with the γ-glycidoxypropyltrimethoxysilane to reduce or substantially eliminate the problems.

Tests were conducted on GDX devices having as a silicone gel encapsulation 14 gels known as DC6635, DC6646, in addition to the DC3-4939 discussed previously, and GE3175, available from the General Electric Company. All of these gels are vinyl and hydride terminated silicones. The titanates were mixed with either DC6219 or DC6279, available from Dow Corning, both of which are vinyl and/or hydride terminated silicones, to constitute the potting compound 16. Improvements were observed when the titanate additive reached the concentration of 0.05 weight percent of the potting compound and increased thereafter. No further improvement could be found after reaching four weight percent of titanate in the silicone encapsulant. In all cases, the titanate was mixed thoroughly with the uncured resin potting compound 16, the potting compound was added to form the structure of FIG. 1 and was cured by heating at one hundred thirty degrees Centigrade for forty-five minutes. Thereafter, the test packages were immersed in boiling Freon ® for varying periods of time. Tests without the titanate additive showed delamination after a short period of time such as three minutes. The additive increased the time before delamination to as much as fifteen hours. Other tests included examination of the gel 14 for visible globules and examination of leads 13' for visible films of γ-glycidoxypropyltrimethoxysilane. Still other tests involved THB tests on operating GDX devices.

γ-glycidoxypropyltrimethoxysilane is an alkoxysilane having epoxy functional components. The titanates react and bond with the excess alkoxy functional components and with hydroxyl groups from the open epoxy ring to prevent them from doing the harm described above. It is therefore inferred that the invention is useful in any silicone resin containing vinyl and/or hydride functional components in which an alkoxysilane is included as an adhesion promoter. It is believed that any titanate having the form Ti(OR)$_4$, where R is an isopropyl, butyl, octyl, or acetylacetonate, will react to bond with the functional components of the alkoxysilane. Titanium butyl titanate, titanium octyl titanate, and titanium acetylacetonate have specifically been shown to be beneficial for this purpose.

Various other modifications and embodiments may be made by those skilled in the art without departing from the spirit and scope of the invention.

I claim:

1. A method for encapsulating an electronic device comprising the steps of: covering the electronic device with an uncured silicone resin having vinyl and or hydride functional terminations and containing an alkoxysilane as an adhesion promoter; and curing the silicone resin, wherein the improvement comprises:
    adding to the uncured silicone resin a quantity of a titanate having the form Ti(OR)$_4$, where R is an isopropyl, butyl, octyl or acetylacetonate, whereby said titanate bonds with excess alkoxy functional components of the alkoxysilane.

2. The method of claim 1 wherein:
    the alkoxysilane is γ-glycidoxypropyltrimethoxysilane.

3. The method of claim 2 wherein:
    the titanate is selected from the group consisting of titanium butyl titanate, titanium octyl titanate and titanium acetylacetonate.

4. The method of claim 3 wherein:
    the adding step comprises the step of making the uncured silicone resin to contain 0.05–4 weight percent of said titanate.

5. The method of claim 1 wherein:
    the electronic device comprises an integrated circuit.

* * * * *